United States Patent [19]

Sedlemeier et al.

[11] Patent Number: 5,083,239

[45] Date of Patent: Jan. 21, 1992

[54] SHIELDING APPARATUS FOR AN ELECTRICAL ASSEMBLY

[75] Inventors: Peter Sedlemeier; Ingeborg Busse; Eduard Mair, all of Munich, Fed. Rep. of Germany

[73] Assignee: Siemens Aktiengesellschaft, Munich, Fed. Rep. of Germany

[21] Appl. No.: 527,429

[22] Filed: May 23, 1990

[30] Foreign Application Priority Data

Jun. 9, 1989 [EP] European Pat. Off. ........ 89110472.1

[51] Int. Cl.$^5$ .............................................. H05K 9/00
[52] U.S. Cl. ................................. 361/424; 174/35 GC
[58] Field of Search .......... 174/35 R, 35 MS, 35 GC, 174/51; 361/397, 398, 399, 412, 413, 415, 417

[56] References Cited

FOREIGN PATENT DOCUMENTS 3604860  2/1986  Fed. Rep. of Germany .
3604860A1 8/1987  Fed. Rep. of Germany .
8803544.1 8/1988  Fed. Rep. of Germany .
2571922  4/1986  France .

Primary Examiner—Leo P. Picard
Assistant Examiner—Donald A. Sparks
Attorney, Agent, or Firm—Hill, Van Santen, Steadman & Simpson

[57] ABSTRACT

Shielding apparatus for an electrical assembly. A shroud that covers a front cover of the assembly is located at the front side of the electrical assembly that is insertable into a magazine. The shroud is snapped onto the front cover with retaining tabs and has laterally resilient contact tabs that are contacted by contact tabs of neighboring shrouds. As a result, the shrouds are directly connected to one another, so that only one electrical junction between the shielding parts is established per assembly. In particular, the shielding effect is so effective that the shrouds can be utilized in radio-frequency electrical systems.

21 Claims, 1 Drawing Sheet

SHIELDING APPARATUS FOR AN ELECTRICAL ASSEMBLY

BACKGROUND OF THE INVENTION

The present invention is directed to a shielding apparatus for an electrical assembly insertable into a module magazine. It is known to manufacture front covers for an electrical assembly out of metal and to fasten thereto thin contact plates that are provided with lateral contact tabs. These contact tabs are fashioned such that they press against the front cover of a neighboring assembly. The grounded front covers, together with the contact plates, enable a gap-free electrical shielding of the assemblies along their front side.

Modern electronic circuits operate with extremely high clock rates and require a shielding. Since the front covers in the row of assemblies are electrically connected in series, a low surface transfer impedance between the front covers is necessary. This requirement of low impedance is degraded in that the front covers and the contact plates are typically composed of different materials, which leads to electrical corrosion, and in that two electrical junctions are present per each front cover.

SUMMARY OF THE INVENTION

An object of the present invention is to reduce the electrical resistance and the manufacturing outlay related to shielding apparatus for electrical assemblies.

This object is achieved by the present invention of a shielding apparatus wherein a strip-shaped contact plate is secured to the front cover of the electrical assembly. This contact plate extends in the longitudinal direction of the front cover and has a plurality of resilient contact tabs positioned toward neighboring front covers. These contact tabs are contacted by the shielding apparatus of the neighboring assemblies. The contact plate, fashioned as a shroud, covers the entire front cover and is directly contacted by the shrouds of the two neighboring assemblies. Since a given shroud is now directly contacted by the neighboring shrouds, the number of electrical junctions per front cover is reduced over prior art devices. Respectively identical materials are in contact with one another and reduce the risk of electrical corrosion. Also the contact resistances are considerably reduced as a result thereof, so that any arising noise currents can be more effectively eliminated.

Since the shroud covers the entire front cover, it can be held on the front cover in a simple manner with the use of a suitable catch means, so that the assembly outlay is correspondingly reduced. Also a significant advantage is that the front cover can now be made of plastic since it is no longer required for the shielding or electrical connection, thereby reducing manufacturing costs.

The contact tabs are arranged along one long side of the shroud with cooperating contact locations which are non-resiliently fashioned. Thus, the arrangement of the non-resilient contact locations in a defined plane establishes uniform contact conditions.

Greater possibilities of variation with respect to the design of the contacts results from the contact tabs being provided on both long sides of the shroud.

Greater spacing tolerances between the front covers can be compensated for by the contact tabs of two neighboring shrouds contacting one another.

In a further embodiment the resilient contact tabs and non-resilient contact locations are arranged in alternating succession on every long side of the shroud, one contact tab of a shroud contacting a non-resilient contact location of the neighboring shroud and the non-resilient contact locations being broader than the resilient contact tabs. This provides a tight interleaving of the contact tabs with the non-resilient contact locations given a high number of contacts having a corresponding large contact surface.

Identical shrouds in the same orientation can be attached to all front covers due to one contact tab of one long side of the shroud lying opposite a non-resilient contact location of the other long side.

Furthermore, the contact tabs can be mirror-symmetrically arranged on both long sides of the shroud. This structure can be employed in both types of contacting. In the combination of resilient contact tabs with stationary cooperating contact locations, the contact tabs are respectively offset by half a division from assembly to assembly. This can be beneficially achieved in that the shroud has a contact tab at one end and a stationary contact location at the other end, and in that the shrouds are secured to the front covers in alternating orientation. When, however, a contact from contact tab to contact tab is desired, then the shrouds are secured to the front covers in the same orientation.

The shroud can be snapped onto the front cover with retaining tabs whose resilient ends engage behind the front cover. This utilizes the spring properties of the shroud for the fastening to the front cover as well.

The retaining tabs can be arranged in the interspaces between the contact tabs. This yields a great plurality of retaining tabs so that the forces occurring when pulling the assembly are reliably intercepted.

Also the retaining tabs can be especially utilized as contact locations in that the retaining tabs server as non-resilient contact locations.

The contact tabs can be bent back onto themselves in the fashion of a semicircle to provide good spring properties.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
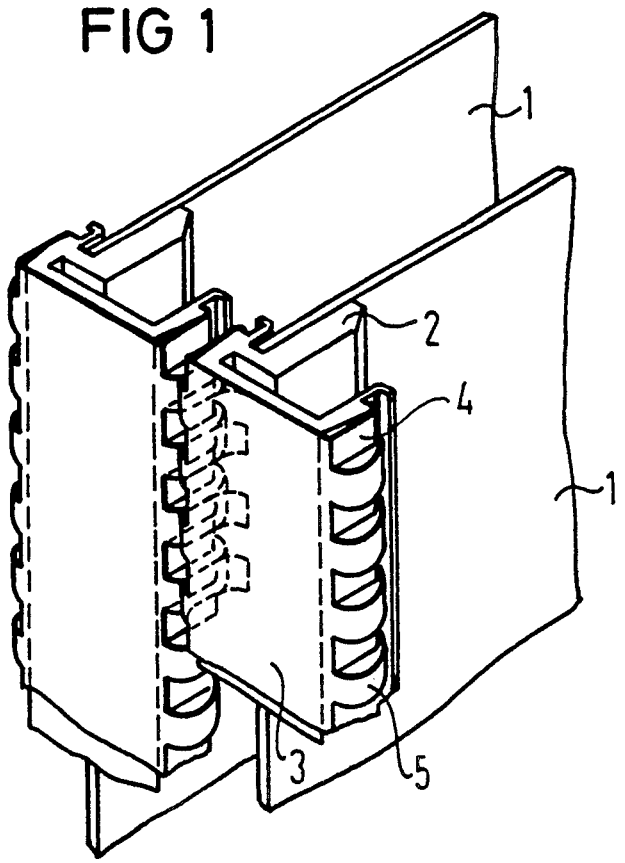
FIG. 1 is a perspective view of a part of two neighboring assemblies having front covers and shrouds.
Figure 2:
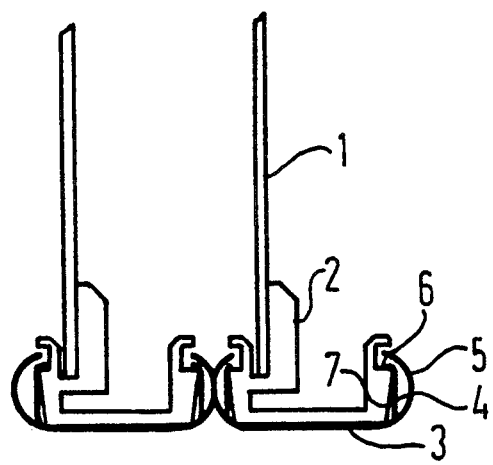
FIG. 2 is a plan view of the parts of FIG. 1.

According to FIGS. 1 and 2, two electrical assemblies are inserted into a magazine (not shown). The assemblies have printed circuit boards 1 to whose front sides are attached front covers 2 which are formed of plastic. Shrouds 3 are snapped onto the front covers 2. Shrouds 3, that are essentially bent into a u-shape have retaining tabs 4 and contact tabs 5 in alternating succession on each of their long sides, these retaining tabs 4 and contact tabs 5 having been produced by shearing and different bending. The contact tabs 5 thereby project beyond the retaining tabs 4. The tabs 5 are mirror-symmetrically arranged on both long sides of the shroud 3.

The shroud 3 extends over the entire length and width of the front cover 2. The contact tabs 5 are contacted by contact tabs 5 of a neighboring assembly. As a result, the entire front side of the fully equipped magazine is covered in sealed radio-frequency fashion.

The retaining tabs 4 are perpendicular to the front side of the assemblies. The free end of each of the retaining tabs 4 is bent toward the front cover 2 and engages behind the front cover 2 at a corresponding latch shoulder 6. The front cover 2 is provided with lateral leading bevels 7 for the retaining tabs 4.

The contact tabs 5 are bent semicircularly back onto themselves and project beyond the front covers 2 in the direction of the neighboring front covers to such an extent that they press resiliently against the contact tabs of the neighboring shrouds 3. A large-area contact between the shrouds 3 is thus established due to the multitude of contact tabs 5.

If the contact tabs 5 of one shroud 3 and the retaining tabs 4 of the neighboring shroud 3 are staggered relative to one another (as can be derived from FIG. 1), then the contact tabs 5 of the one shroud 3 will contact the retaining tabs 4 of the neighboring shroud 3. The retaining tabs 4 then become contact locations which are non-resilient.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Shielding apparatus in an electrical assembly insertable into a module magazine, a strip-shaped contact plate being secured to a front cover of said electrical assembly, the contact plate extending in a longitudinal direction of the front cover and having at least a plurality of resilient contact tabs positioned toward neighboring front covers, these contact tabs being contacted by the shielding apparatus of the neighboring assemblies, comprising the contact plate being a shroud covering the entire front cover and being directly contacted by two shrouds of two neighboring assemblies, respectively.

2. The shielding apparatus according to claim 1, wherein the contact tabs are provided along at least one long side of the shroud with cooperating contact locations which are non-resiliently fashioned.

3. The shielding apparatus according to claim 1, wherein the contact tabs are provided on both long sides of the shroud.

4. The shielding apparatus according to claim 3, wherein at least one contact tab on each of two neighboring shrouds contact one another.

5. The shielding apparatus according to claim 3, wherein the resilient contact tabs are arranged in alternating succession on each long side of the shroud with non-resilient contact locations; wherein respectively one contact tab of the shroud contacts a non-resilient contact location of a neighboring shroud; and wherein the non-resilient contact locations are broader than the resilient contact tabs.

6. The shielding apparatus according to claim 5, wherein at least one contact tab of one long side of the shroud lies opposite a non-resilient contact location of the other long side of the shroud.

7. The shielding apparatus according to claim 5, wherein the contact tabs are mirror-symmetrically arranged on both long sides of the shroud.

8. The shielding apparatus according to claim 1, wherein the shroud is snapped onto the front cover with retaining tabs on the shroud whose resilient ends engage behind the front cover.

9. The shielding apparatus according to claim 8, wherein the retaining tabs are arranged in interspaces between the contact tabs.

10. The shielding apparatus according to claim 9, wherein the retaining tabs are non-resilient contact locations.

11. The shielding apparatus according to claim 1, wherein the contact tabs are bent back onto themselves in a semicircle.

12. The shielding apparatus according to claim 3, wherein the contact tabs are mirror-symmetrically arranged on both long sides of the shroud.

13. The shielding apparatus according to claim 5, wherein the shroud is snapped onto the front cover with retaining tabs on the shroud whose resilient ends engage behind the front cover, the retaining tabs being arranged in the interspaces between the contact tabs and serving as the non-resilient contact locations.

14. Shielding apparatus in an electrical assembly insertable into a module magazine, a strip-shaped contact plate being secured to a front cover of said electrical assembly, the contact plate extending in a longitudinal direction of the front cover and having at least a plurality of resilient contact tabs positioned toward neighboring front covers, these contact tabs being contacted by the shielding apparatus of the neighboring assemblies, comprising the contact plate being a shroud covering the entire front cover and being directly contacted by two shrouds of two neighboring assemblies, respectively, the contact tabs being provided on both long sides of the shroud and at least one contact tab on each of two neighboring shrouds contacting one another.

15. The shielding apparatus according to claim 14, wherein the shroud is snapped onto the front cover with retaining tabs on the shroud whose resilient ends engage behind the front cover.

16. The shielding apparatus according to claim 15, wherein the retaining tabs are arranged in interspaces between the contact tabs.

17. The shielding apparatus according to claim 16, wherein the retaining tabs are non-resilient contact locations.

18. The shielding apparatus according to claim 14, wherein the contact tabs are bent back onto themselves in substantially a semicircle.

19. Shielding apparatus in an electrical assembly insertable into a module magazine, a strip-shaped contact plate being secured to a front cover of said electrical assembly, the contact plate extending in a longitudinal direction of the front cover and having at least a plurality of resilient contact tabs positioned toward neighboring front covers, these contact tabs being contacted by the shielding apparatus of the neighboring assemblies, comprising the contact plate being a shroud covering the entire front cover and being directly contacted by two shrouds of two neighboring assemblies, respectively, the contact tabs being provided on both long sides of the shroud and arranged in alternating succession on each long side of the shroud with non-resilient contact locations, respectively one contact tab of the shroud contacting a non-resilient contact location of a neighboring shroud and the non-resilient contact locations being broader than the resilient contact tabs, the contact tabs of one long side of the shroud lying opposite of non-resilient contact locations of the other long side of the shroud.

20. The shielding apparatus according to claim 19, wherein the shroud is snapped onto the front cover with retaining tabs on the shroud whose resilient ends engage behind the front cover, the retaining tabs being arranged in the interspaces between the contact tabs and serving as the non-resilient contact locations.

21. The shielding apparatus according to claim 19, wherein the contact tabs are bent back onto themselves in substantially a semicircle.

* * * * *